United States Patent [19]

Reeber et al.

[11] Patent Number: 5,075,130
[45] Date of Patent: Dec. 24, 1991

[54] SURFACE MODIFICATION OF BORON CARBIDE TO FORM POCKETS OF SOLID LUBRICANT

[75] Inventors: Robert R. Reeber, Chapel Hill, N.C.; Wei K. Chu; Ning Yu, both of Houston, Tex.

[73] Assignee: The United States of America as represented by the Secretary of the Army, Washington, D.C.

[21] Appl. No.: 618,195

[22] Filed: Nov. 19, 1990

[51] Int. Cl.$^5$ .................... B05D 3/06; C23C 14/00
[52] U.S. Cl. .................... 427/38; 427/53.1; 427/39; 204/192.16
[58] Field of Search ............ 427/38, 39, 53.1; 204/192.15, 192.16, 192.22

[56] References Cited

U.S. PATENT DOCUMENTS

| | | | |
|---|---|---|---|
| 3,177,564 | 4/1965 | Reynolds et al. | 29/182.5 |
| 3,781,205 | 12/1973 | Cairns | 252/12.6 |
| 3,916,075 | 10/1975 | Dimigen et al. | 428/472 |
| 3,988,955 | 11/1976 | Engle et al. | 427/38 |
| 4,656,052 | 4/1987 | Satou et al. | 427/38 |
| 4,764,394 | 8/1988 | Conrad | 427/38 |
| 4,775,548 | 10/1988 | Lankford, Jr. | 427/38 |
| 4,824,262 | 4/1989 | Kamigaito et al. | 384/42 |
| 4,855,026 | 8/1989 | Sioshansi | 204/192.11 |

OTHER PUBLICATIONS

Bull et al., "High-Dose Ion Implantation of Ceramics: Benefits and Limitations for Tribology", *J. of Materials Science*, vol. 23, 4217-4230 (1988) no month.
Wei et al., *Materials Science and Engineering*, vol. 90, 307-315 (1987) no month.
Singh et al., *J. Mater. Res.*, vol. 3(6), 1119-26 (Nov./Dec. 1988).
Nastasi et al., *J. Mater. Res.*, vol. 3(6), 1127-1133 (Nov./Dec. 1988).
DeKoven et al., *Surface Coatings & Tech.*, 36(1-2), 207-218 (Apr. 1988).
Jervis, *Mat. Res. Soc. Symp. Proc.*, 157 (1990) no month.
Jervis et al., "Laser and Optically Assisted Processing . . .", J. Narayan, Ed. Proc. SPIE 1190 (1989) no month.
Hirvonen et al., "Migration of Carbon in Tempered Martensitic Steel During Excimer Laser Melting", no data.
Reeber et al., 10th Int'l. Symp. on Boron, Borides (Aug. 27-30, 1990), "Tribological Properties of N-Implanted Boron Carbide".
Was et al., Int. Conf. on Ion Beam Modification of Material, "Hardness & Friction of $N_2^+$ and $Al^+$ Implanted B4", (Sep. 1990).
Hirvonen et al., *Appl. Phys. Lett.*, 51(4) (Jul. 1987).
McHargue, *Int'l Metals Reviews*, 31(2), 49-76 (1986) no month.
Rothenberg et al., *Nuclear Instruments & Methods in Physics Research*, B1, 291-300 (1984) no month.

*Primary Examiner*—Shrive Beck
*Assistant Examiner*—Marianne Podgett
*Attorney, Agent, or Firm*—Saul Elbaum; Freda L. Krosnick

[57] ABSTRACT

A method of forming solid lubricant pockets in boron based and boron containing ceramic materials (i.e. boron carbide) by nitrogen ion implantation and laser annealing. By employing the present method said solid lubricant pockets may be formed in approximately the first 750 Angstroms of the surface and near surface regions of, for example, a polycrystalline boron carbide sample. Moreover, the present invention enables one to direct the formation of solid lubricants to specific areas on the boron based or boron containing ceramics to meet a specific need. The product of the present invention is a ceramic having a reduced coefficient of friction, greater durability, and reduced chipping and fracture.

8 Claims, 4 Drawing Sheets

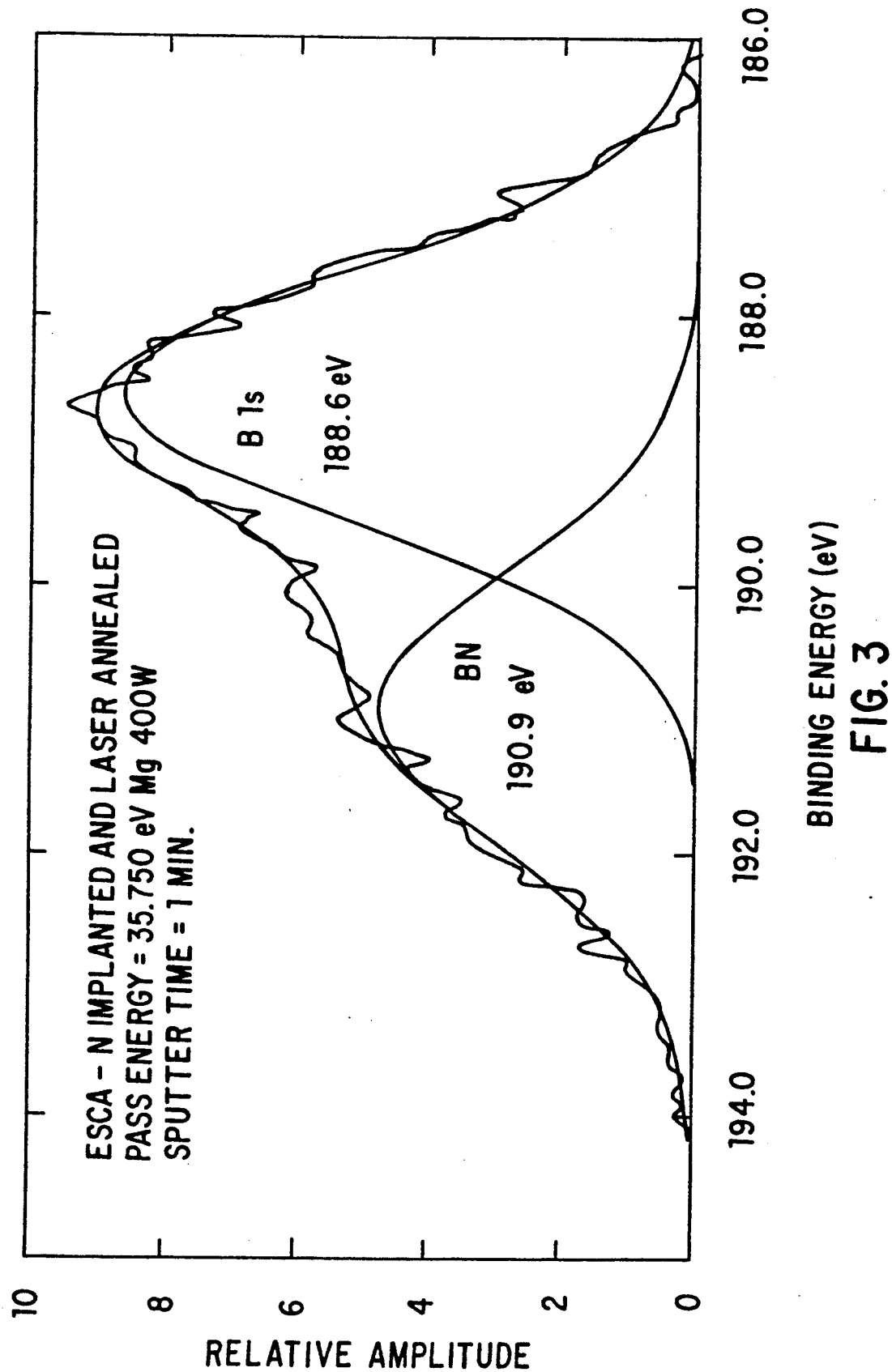

SURFACE MODIFICATION OF BORON CARBIDE TO FORM POCKETS OF SOLID LUBRICANT

RIGHTS OF THE GOVERNMENT

The invention described herein may be manufactured, used and licensed by or for the U.S. government for governmental purposes without the payment to us of any royalties thereon.

BACKGROUND OF THE INVENTION

This application is filed concurrently with related patent application Ser. No. 07/614,654, now abandoned.

The present invention relates to a boron nitride/boron carbide composite and a method for making said composite material. Use of the present invention in the ceramic art increases the durability of ceramic articles by reducing friction, wear, chipping and fracture of the articles. The present invention can be used in the manufacture of all boron based, or boron containing ceramic materials; and the invention can especially be employed in ceramic components such as bearings or internal moving parts of a ceramic engine. Generally speaking, the present invention is particularly suitable for improving the physical and chemical properties of ceramic work pieces designed to be exposed to excessive wear, erosion, temperatures and fatigue and for work pieces which would benefit from exhibiting a lower coefficient of friction at their surfaces.

Studies have been conducted which indicate that reduction of friction on the surface of materials enhances the materials' durability. Moreover, application to ceramic, for example, of materials having great strength would also increase the life of resulting article. These facts are well known to one skilled in the composite art.

Boron carbide, one of the hardest and most durable materials known to man, has a hardness of approximately 45% that of the hardness of a diamond. In addition, boron carbide has a low specific density. Therefore, it has a high strength to weight ratio. These properties make boron carbide an attractive material for application to articles requiring wear resistance and a high strength to weight ratio, such as cutting tools.

Ion implantation of ceramics has been recently studied and summarized by Bull and Page in *Journal of Material Science*, Volume 23, p. 4217 (1988). Ion-implantation is a process whereby all near-surface and surface characteristics of materials may be altered. It is used to change the surface chemistry of ceramics in order to influence the mechanical properties thereof. Ion implantation of ceramics is apparently a complex phenomenon. This phenomenon has tribological significance—tribology is the study of friction and wear between interacting parts and involves means of reducing the friction. Although it would appear that ion implantation would be an ideal technique for modifying the wear resistance and durability of materials, such as ceramics, studies conducted indicate that the effects of ion implantation, in general, are unpredictable. Consequently, the effects of ion implantation must be experimentally determined for each material in which it is sought. In addition, the various methods of ion implantation may effect the resulting properties of the final product. Hence, based on the technological knowledge available, all that one skilled in the art of ion implantation can conclude is that both the method of ion implantation and the materials in which ion implantation is sought play a major role in the properties resulting from said treatment. The effects of these considerations, however, are complex and unpredictable. The unpredictable nature of this art area makes residual damage structure modeling difficult.

As an aside, Bull and Page do make mention of ionimplantation combined with some post-implantation annealing. The specific ion-implantation and annealing processes employed within the present invention, however, are nowhere disclosed or hinted at therein.

Studies conducted by Wei et al., *Materials Science and Engineering*, Volume 90, p. 307 (1987), have inferred that ion beam modification treatments of silicon carbide (SiC) type ceramics and other ceramics reduce the friction and the wear of said ceramics. This sought after property is attained through the resulting formation of a thin layer of lubricious oxides.

The use of laser treatments in the ceramics art has been shown to significantly improve the fracture strength of said materials. A study reported by Singh et al. in *Journal of Material Res.*, Volume 3, p. 1119 (1988), indicated such property improvements. Singh et al, however, makes no mention of the combination of laser treatments with nitrogen ion-implantation to improve durability of ceramics.

Additional studies in tribology were conducted by Nastasi et al. and DeKoven et al. Both groups conducted wear studies of nitrogen implantation of boron carbide; and both research groups came up with conflicting results of the effects of their implantation on the frictional coefficient of the materials used. DeKoven et al., in *Surface Coatings Technology*, Volume 36, p. 207 (1988), reported a significant increase in the frictional coefficient after nitrogen implantation of boron carbide; whereas, Nastasi et al., in *Journal of Material Res.*, Volume 3, p. 1127 (1988), found a marked reduction in the frictional coefficient after nitrogen implantation into hot-pressed boron carbide ($B_4C$). This reduction in frictional coefficient was attributed to the possibility of the formation of nitride-like "bonds." Nastasi et al. further postulated in their report that nitrogen implantation resulted in a thermodynamically more stable chemistry. Nowhere, however, do either Nastasi et al. or DeKoven et al. even remotely suggest the combination of nitrogen ion-implantation with laser or rapid thermal annealing into ceramics. Nor do they quantify the formation of bonding.

The present invention overcomes the unpredictable effects of creating a more durable, ceramic material having reduced friction properties. The present invention enables one skilled in the art of ceramics to produce a consistently durable, wear resistant ceramic product. The present invention involves the novel combination of nitrogen ion implantation with laser or rapid thermal annealing treatments of ceramics to form the product claimed herein. X-Ray Photoelectron Spectroscopy results indicate that there is minimal, insignificant boron - nitride bonding unless both nitrogen ion-implantation and laser or rapid thermal annealing have been performed.

BRIEF SUMMARY OF THE INVENTION

This invention deals with a boron based and boron containing ceramic material having reduced friction properties. Moreover, the material of the present invention has greater wear and durability than the conventional ceramic materials available. The invention herein resides in the method of producing durable ceramics, as well as the final product produced.

The invention resides in the combination of the the teachings of the prior art set forth above.

In contrast to the hard properties present to boron carbide, boron nitride is well known to possess the properties of being a soft and lubricious solid which is relatively stable at high temperatures. Boron nitride has been nicknamed "white graphite" because of these properties. The present invention successfully provides for a surface/near surface wear resistant composite of hot-pressed boron carbide and lubricious boron nitride. This is accomplished by combining the two well-known arts of nitrogen implantation with conventional laser or rapid thermal post-annealing.

The invention herein resides in the combination of the teachings of the prior art set forth above. Although the present invention employs the well-known processes of nitrogen implantation and laser or rapid thermal post-annealing, nowhere in the structural ceramic literature is the combination of these two processes taught or suggested. Moreover, the boron based or boron containing ceramic product resulting from the claimed process possesses far superior durability properties than available in conventional ceramic materials.

Accordingly, it is an object of the present invention to provide a boron based or boron containing ceramic material having enhanced durability.

A further object of the present invention is to form a surface/near surface wear resistant ceramic composite of commercial grade, hot-pressed polycrystalline boron carbide and lubricious boron nitride by combining nitrogen implantation with a laser or rapid thermal post-anneal process involving surface melting without any detrimental surface sputtering or ablation.

It is an object of the invention to produce a ceramic material having reduced friction.

It is a further object of the present invention to provide a ceramic material having reduced chipping and fracture characteristics.

A still further object of the present invention is to produce a durable ceramic material using well-known processes.

Other objectives and features of the present invention will be apparent from the following detailed description of the invention and claims.

BRIEF DESCRIPTION OF THE DRAWINGS

FIG. 3 is a graphic illustration of X-Ray Photoelectron Spectroscopy boron binding energy spectrum after nitrogen ion implantation and XeCl laser annealing.

Figure 1:
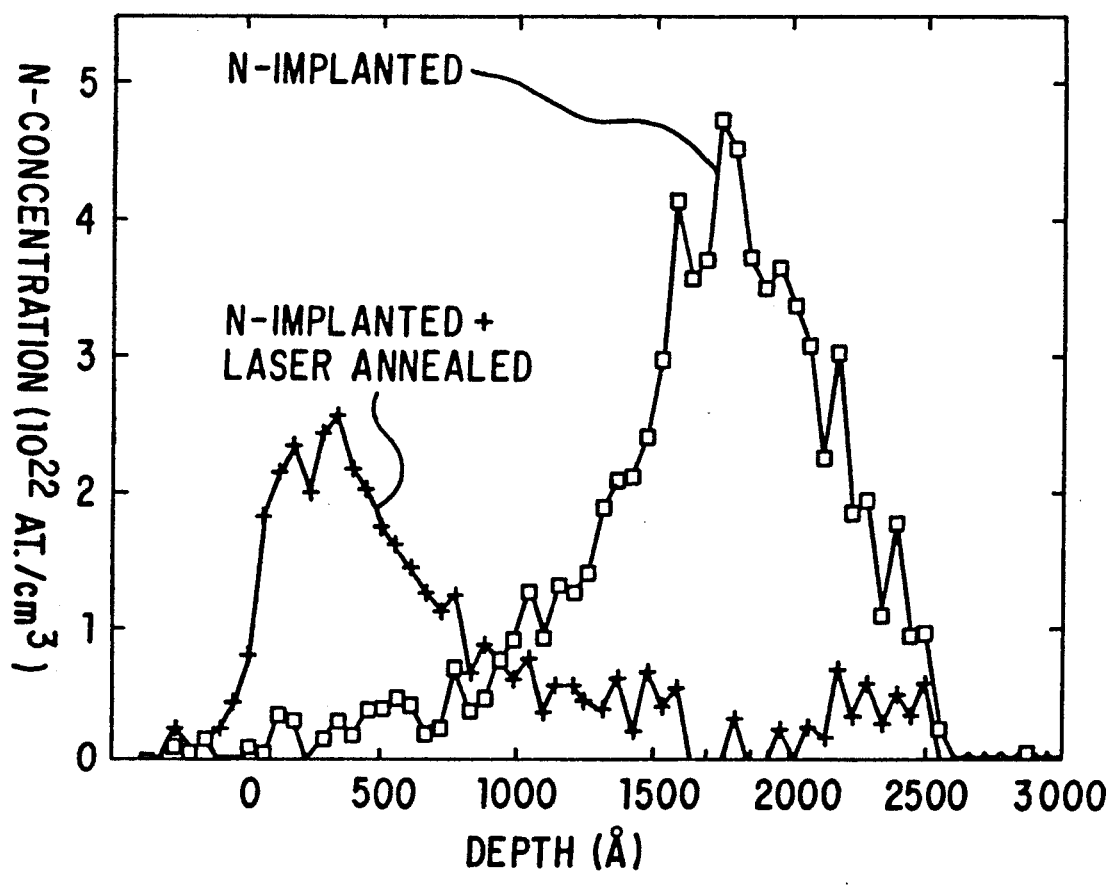
FIG. 1 is a graphic illustration of Rutherford Backscattering Spectrometry profiles for nitrogen ions implanted in a boron carbide ceramic sample. Nitrogen ion implantation was performed at 100 KeV with $4 \times 10^{17}$ nitrogen ions/cm$^2$. Depicted are results with and without xenon chloride laser annealing.

The drawings will be further discussed in the Detailed Description of the Invention in order to provide a better understanding and description of the present invention.

DETAILED DESCRIPTION OF THE INVENTION

The present invention deals with a method for making a boron based and boron containing ceramic composite material having increased durability. The composite material within the scope of the invention possesses specific desirable properties, such as increased durability, reduced friction, reduced wear, chipping and fracture potential. The novelty of the present invention resides in the claimed method of producing said ceramic material having these properties, as well as in the final ceramic material itself.

As set forth above, the present invention combines the well-known individual procedures of nitrogen implantation along with laser or rapid thermal post-annealing. Use of these two conventional procedures together in the same structural ceramic process has to date never been suggested. The use of these two conventional procedures is critical to the success of the present invention.

A boron nitride/boron carbide composite is formed in the present invention. The composite is formed either on the surface or near the surface of a boron based or boron containing ceramic material, such as a polycrystalline boron carbide sample. This is accomplished by implanting nitrogen ions into said composite using commercial implanters, such as an Extrion ® (manufactured by Varian Corporation of Sunnyvale, Calif.), a Nova ® implanter (manufactured by Eaton and National Electrostatic Corporation of Middleton, Wis., etc. Ion implantation is then followed by annealing said product using, for example, a conventional laser, such as a xenon chloride laser, or a Krypton-fluoride (KrF) excimer laser.

The annealing process is a laser treatment or a rapid thermal treatment capable of near surface melting of the boron based or boron containing, i.e. boron carbide, ceramic during which treatment the deeply implanted nitrogen ions diffuse towards the laser heated surface and form boron nitride. A xenon chloride laser, for example, with an energy density of 2 joules/cm$^2$ and a pulse time of 45 nanoseconds is sufficient to optimize the formation of boron nitride in the near surface layer and to restore the structural integrity of the boron carbide present. Approximately 50% of the originally implanted nitrogen ions remain in the near surface region of the boron carbide sample. X-ray photoelectron spectroscopy (XPS) was used to determine the degree of boron-nitrogen bonding. When the annealed product was combined with conventional argon sputtering, XPS measurements indicated that a large amount of boron nitride—more than 70% of the nitrogen remaining from the originally implanted nitrogen was formed in the top 750 Angstroms of the boron carbide sample surface. This is a favorable result of the present invention.

The following is a more detailed description of how the present invention may be practiced:

A commercially available, hot-pressed, polycrystalline sample of boron carbide is polished with a diamond paste, such as Metadi II ®, manufactured by Buehler Ltd. of Lake Bluff, Ill. or Microid ®, manufactured by Leco Corporation of St. Joseph, Mich. The sample is polished using standard metallographic techniques, which are conventionally practiced at various university geology departments and ceramic engineering departments. Once the polycrystalline sample is polished to satisfaction, nitrogen ions are implanted onto the boron carbide sample using conventional nitrogen implantation techniques and fixtures.

After nitrogen implantation, the boron carbide sample illustrated a dramatic increase in reflectivity. The change in reflectivity was measured using a laser reflectometer [Metrologic Neon Laser, He-Ne type]. The surface of said nitrogen implanted, boron carbide sample was subsequently annealed and surface melted with a xenon chloride laser. The annealing process employed conventional techniques well known to the skilled artisan. After such surface annealing and melting, the reflectivity of the boron carbide sample is restored to the unimplanted value.

The surface treatment of the boron carbide sample not only restores the reflectivity of the sample, but it also left the sample smooth. This is indicated by an absence of detrimental sputtering or mechanical spoiling. The resulting chemical composition of the nitrogen-implanted and annealed portion of the surface was boron nitride and boron carbide.

The boron carbide hard material which is found in close association with the nitrogen-implanted and annealed portion of the surface boron nitride would act as a wear resistant material to protect the lubricious boron nitride from abrading away. Meanwhile the boron nitride, or similar material, would act as a steady supply of solid lubricant to reduce the coefficient of friction on the hard material surface.

The method of the present invention allows the boron nitride (lubricant)/boron carbide composite to be formed in approximately the top 750 Angstroms of the boron based or boron containing ceramic surface. The advantage of the present invention is that implanting nitrogen below the surface of the boron carbide surface material allows for much of the lubricant to remain below the surface of the material, and therefore, the lubricant will not be depleted or worn down.

The present invention may additionally be practiced in a manner such that the nitrogen ion implantation and subsequent annealing of the boron based or boron containing ceramic material may be directed to very specific, designated portions of the material. This may be accomplished by masking or covering the portions of the ceramic material in which one does not wish the solid, boron nitride lubricant to form. This is accomplished by using masking materials, or nitrogen ion implantation blocking materials, such as silicon, carbon or the like. These ion implantation blocking materials are to be placed onto the ceramic sample prior to nitrogen ion implantation. Once the masking materials are securely in place, the process of nitrogen ion implantation and subsequent annealing are performed. Such blocking materials may be of various designs to accommodate one's individual needs. Blocking/masking materials may be in the form of a stencil.

The present invention will be more specifically described in the example set forth below. The invention herein should in no way be limited to this illustration.

EXAMPLE I

A commercially available, hot-pressed polycrystalline boron carbide sample having a one inch diameter and a thickness of approximately 0.450 inches was polished with Metadi II ®, a conventional diamond paste, by standard metallographic techniques. This sample was polished to a 0.25 micron finish. Upon completion of the polishing, nitrogen ions were implanted into said sample using an Extrion ® implanter manufactured by Varian Corporation. The implanting was performed at 100 keV (kilo electron volts). This was accomplished at room temperature; and a total dose of $4 \times 10^{17}$ nitrogen ions per square centimeter was deposited into one half of the sample surface area.

A portion, approximately 20%, of the surface was subsequently annealed using a xenon chloride laser pulsed at 2 joules/cm$^2$ and a dwelling time of 45 nanoseconds. The sample was then examined at an incident angle of 70 degrees with a 0.6 mW helium-neon laser. The specular reflectance at this angle indicated a mean reflective power of 19.0 micro watts before nitrogen implantation; 31.6 micro watts after nitrogen implantation, and 19.1 micro watts after the combined treatment of nitrogen implantation and xenon chloride laser treatments. Restoration of the mean reflective power upon subsequent laser annealing of the material indicates that the structural characteristics and integrity of the sample have also been restored. The strength of the sample was not reduced with the potentially detrimental laser treatment.

After the surface was laser annealed, the sample surface was melted smooth without detrimental laser sputtering or mechanical spoiling.

The nitrogen depth profiles in the near surface region (the first 750 Angstroms from the sample surface) of the boron carbide sample treated by nitrogen implantation as well as xenon chloride laser treatments were determined using a conventional 1.91 MeV helium-ion Rutherford Backscattering spectrometer (RBS). This is an apparatus which analyzes the composition or presence of nitrogen without bonding information. The results obtained using said RBS is inclusive of the presence of all nitrogen—bonded, unbonded, etc. The results of the depth profiles obtained are set forth in FIG. 1.

The graph set forth as FIG. 1 indicates that a greater concentration of nitrogen is present in the near surface region of the boron carbide sample when both nitrogen implanted AND laser annealed, as opposed to the portion of the boron carbide sample which was merely nitrogen implanted. Increased presence of the nitrogen hexagonally bonded to boron in the near surface region of the sample is a sought after result of the present invention.

This chemical bonding of boron and nitrogen near the surface of the boron carbide sample was further evaluated and ascertained using x-ray photoelectron spectroscopy with conventional 3 keV (kilo electron volts) argon sputtering. The machine used was a Phi 5400 ®, manufactured by Perkin Elmer Corporation of Norwalk, Conn.; and the analysis was carried out at an angle of 45 degrees and with acquisition time of 1.67 to 5 minutes. The results of this analysis is set forth in graph form in FIG. 2.

Figure 2A:
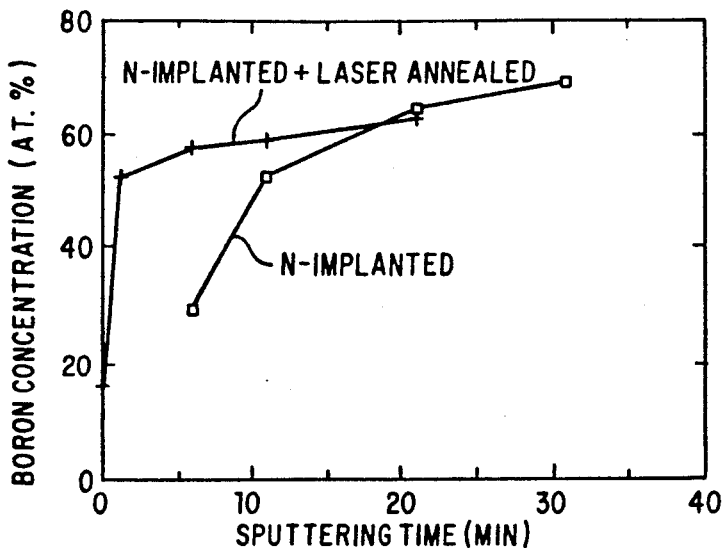
FIG. 2 is a graphic illustration of X-Ray Photo-electron Spectroscopy combined with argon sputtering before and after xenon chloride laser annealing for (a) boron, (b) carbon, and (c) nitrogen near the surface of the boron carbide sample.
Figure 2B:
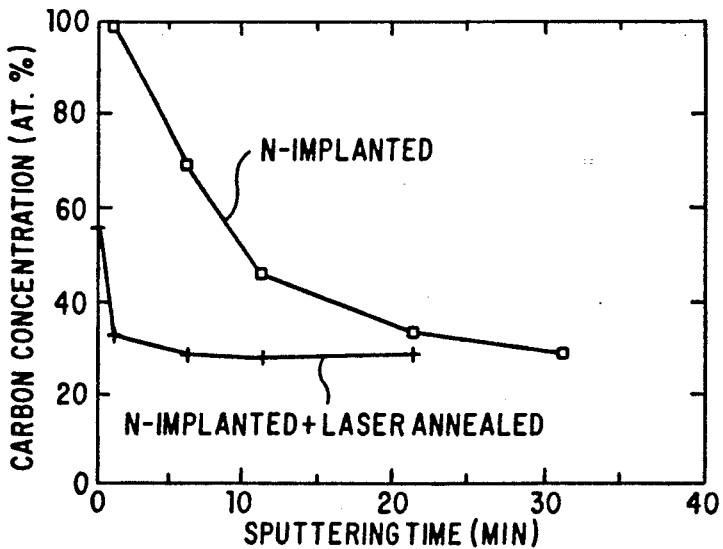
Figure 2C:
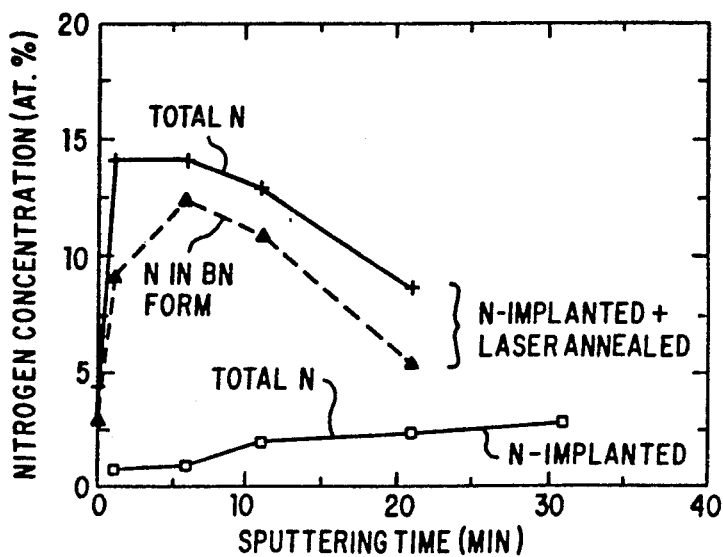

Graph 2c, set forth in FIG. 2, illustrates that the nitrogen concentration near surface is greatly enhanced by the treatment of the boron based sample with nitrogen ion implantation and laser annealing. Moreover, this graph further illustrates that the majority of nitrogen near the surface of the sample is found to be in the bound form having hexagonal-type bonded boron and nitrogen. In addition, note that FIG. 3 illustrates that after annealing the substrate, over 20% of hexagonally bonded boron and nitrogen was formed near its surface.

Note that hexagonal-type bonded boron and nitrogen are not to be confused with hexagonal boron nitride. When referring to hexagonal herein, reference is merely made to the type of bonding, not to the configuration of the entire compounds formed.

The portion of the boron carbide sample surface which was not laser annealed had no measureable surface boron nitride present. Moreover, it had minimal quantities of boron nitride at any depth therein. The graphs set forth in FIG. 2 illustrate this observation.

Since hexagonal boron nitride is a well known solid lubricant, the frictional coefficients of the nitrogen implanted and laser annealed boron carbide sample is significantly reduced. The presence of boron nitride in the near surface of the sample is the sought after result of the present invention.

Figure 4:
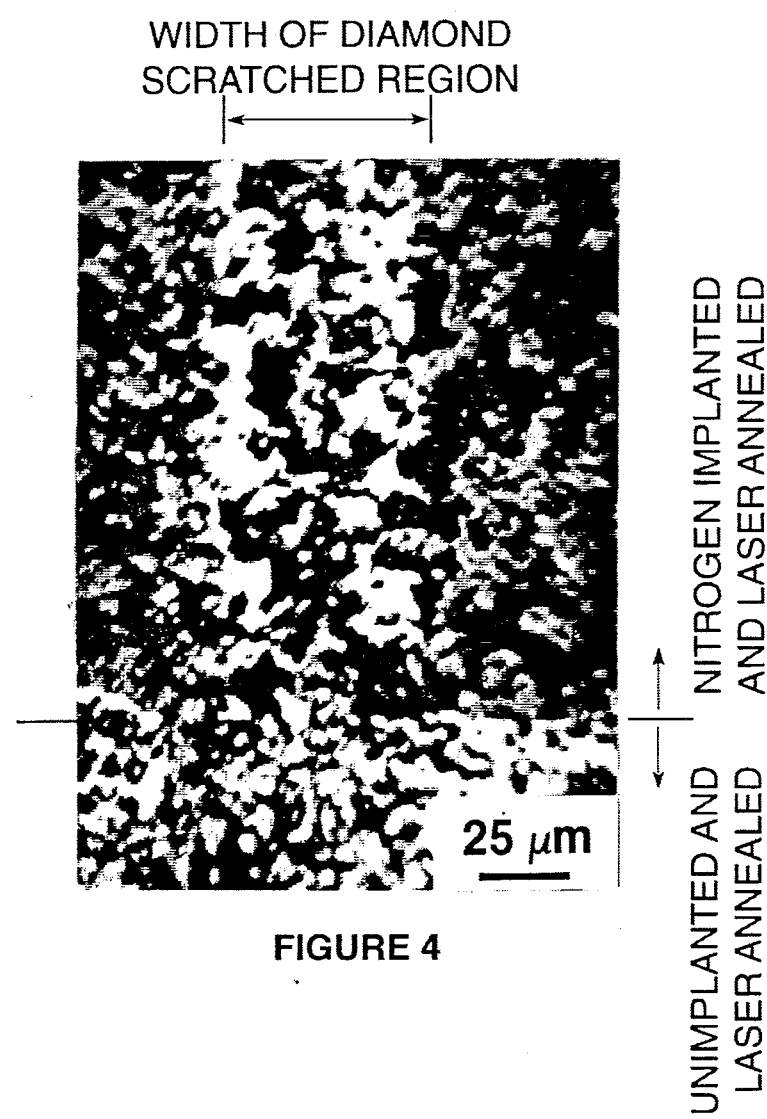
FIG. 4 is a light microscope photograph of the unimplanted and the nitrogen implanted regions of the boron carbide sample after laser annealing and scratching with a diamond stylus at a constant load of 10 g.

The formation of hexagonal-type bonded boron nitride at the surface and near surface of the boron carbide sample was confirmed by a scratch hardness test. In a scratch hardness test a diamond stylus is drawn across nitrogen implanted and laser-annealed portions of the boron carbide ceramic sample under a load of 10 grams. The scratching was done in a linear mode; and the scratch was photographed by a conventional light microscope. The relative hardness of a surface is inversely proportional to the width of the scratch. The broader scratch in the nitrogen implanted and laser annealed region of the sample indicates that it is somewhat softer than the unimplanted and laser annealed region. Moreover, a broader scratch in the nitrogen implanted and laser annealed region of the sample was also observed than that seen in a sample which was nitrogen ion implanted but not subsequently laser annealed. The surface of the resulting ion-implanted and laser annealed boron carbide sample has properties which will enhance its durability and reduce its coefficient of friction. The scratch tests illustrated in FIG. 4 qualitatively confirm this conclusion.

EXAMPLE II

Using the above sample, additional analysis was conducted. The analysis involved the different concentrations of the elements present and involved in the process claimed herein. They play a significant role in the illustration of the present invention.

The relative atomic concentrations and chemical bonding of boron, carbon and nitrogen near the surface of the boron carbide ceramic sample were determined by XPS measurements. Note that Graphs 2(a), 2(b) and 2(c) in FIG. 2 illustrate these relative concentrations both before and after laser annealing of the sample. For the nitrogen implanted and unannealed as well as for the nitrogen implanted and annealed surfaces of the sample, the surface was found to be rich in the presence of carbon atoms. The concentration of the carbon atoms, however, changed dramatically with the depth of the sample. This was probably due to the diamond paste trapped as a consequence of the polishing operation. Even after ion sputtering, which corresponds to a depth of 730 Angstroms, the ratio of boron atoms to carbon atoms remained about 2.3 for the nitrogen implanted region.

The nitrogen profiles illustrated in Graph 2(c) of FIG. 2, and obtained using XPS analysis have a similar trend to the analysis obtained from RBS measurements and illustrated in FIG. 1. The comparison and analysis of the amount of hexagonal-type bonded boron nitride bonded nitrogen near the boron carbide sample surface (see FIG. 3) with the amount of total nitrogen present (see Graph 2(c), in FIG. 2) illustrates that greater than 70% of the nitrogen atoms reacted with boron during the laser annealing process to form boron nitride.

The process of the present invention is not only a process for producing a durable ceramic having a low coefficient of friction, it is also an efficient process for attaining said end goal. Said invention is not limited to the treatment of boron carbide as the ceramic material; any boron based or boron containing ceramic material may be treated in the manner claimed herein.

The nitrogen implanted part of the sample had minimal amounts of boron nitride present. Most of the nitrogen, after mere nitrogen implantation, was unbonded. Combining the implantation of nitrogen with laser annealing results in a substantial bonding of the implanted nitrogen to form the lubricious boron nitride. The properties gained by the ceramic sample by the presence of boron nitride on its surface and near surface attributes to its improved durability properties.

Although the invention has been described with reference to a specific embodiment, it is to be understood that the invention herein is not to be limited to said precise embodiment. Various changes and modifications may be effected by one skilled in the art without departing from the scope or spirit of the present invention.

We claim:

1. A method of forming a solid lubricant in a boron based or boron containing ceramic material comprising
    implanting nitrogen ions into said boron based or boron containing ceramic material; and
    laser annealing said nitrogen ion implanted ceramic material.

2. The method in accordance with claim 1, wherein said nitrogen ion implantation is performed at 100 KeV with a total dose of $4 \times 10^{17}$ nitrogen ions/cm$^2$.

3. The method in accordance with claim 1, wherein said laser annealing of said nitrogen ion implanted boron based or boron containing ceramic material is performed using a xenon chloride laser.

4. The method in accordance with claim 3, wherein the laser density of the xenon chloride laser ranges from about 1.5 joules/cm$^2$ to about 2.0 joules/cm$^2$, at 45 nanosecond dwell time.

5. The method in accordance with claim 1, wherein said boron based or boron containing ceramic material is boron carbide.

6. The method in accordance with claim 1, wherein said solid lubricant formed is boron nitride.

7. A method of forming pockets of a solid lubricant on a boron based or boron containing ceramic material comprising
    covering a predetermined portion of said ceramic material designated to not receive the formation of said solid lubricant with a nitrogen ion implantation blocking material;
    implanting nitrogen ions into said boron based or boron containing ceramic material; and
    laser annealing said nitrogen ion implanted ceramic material.

8. The method in accordance with claim 7, wherein said nitrogen ion implantation is performed at 100 keV with a total dose of $4 \times 10^{17}$ nitrogen ions/cm$^2$.

9. The method in accordance with claim 7, wherein said laser annealing of said nitrogen ion implanted boron based or boron containing ceramic material is performed using a xenon chloride laser.

10. The method in accordance with claim 9, wherein the laser density of the xenon chloride laser ranges from about 1.5 joules/cm$^2$ to about 2.0 joules/cm$^2$, at 45 nanosecond dwell time.

11. The method in accordance with claim 7, wherein said boron based or boron containing ceramic material is boron carbide.

12. The method in accordance with claim 7, wherein said solid lubricant formed is boron nitride.

13. The method in accordance with claim 7, wherein said ion implantation blocking material is selected from the group consisting of silicon, carbon.

14. The method in accordance with claim 13, wherein said nitrogen ion implantation blocking materials may be in the form of a stencil.

* * * * *